(12) United States Patent
Ueno et al.

(10) Patent No.: US 9,006,763 B2
(45) Date of Patent: Apr. 14, 2015

(54) SEMICONDUCTOR LIGHT-EMITTING DEVICE AND LIGHT SOURCE DEVICE USING THE SAME

(75) Inventors: Yasuharu Ueno, Osaka (JP); Toshiaki Kurachi, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 575 days.

(21) Appl. No.: 13/257,805

(22) PCT Filed: May 19, 2010

(86) PCT No.: PCT/JP2010/003361
§ 371 (c)(1),
(2), (4) Date: Sep. 20, 2011

(87) PCT Pub. No.: WO2010/134331
PCT Pub. Date: Nov. 25, 2010

(65) Prior Publication Data
US 2012/0007131 A1    Jan. 12, 2012

(30) Foreign Application Priority Data
May 22, 2009  (JP) ................... 2009-124454

(51) Int. Cl.
*H01L 33/00* (2010.01)
*H01L 33/50* (2010.01)
(Continued)

(52) U.S. Cl.
CPC ............ *H01L 33/508* (2013.01); *H01L 33/54* (2013.01); *H01L 33/58* (2013.01); *H01L 33/62* (2013.01); *H01L 2224/48091* (2013.01); *H01L 2924/3025* (2013.01)

(58) Field of Classification Search
CPC ..... H01L 33/501; H01L 33/50; H01L 33/502; H01L 33/504; H01L 33/508; H01L 33/54; H01L 33/58; H01L 33/62; H01L 2924/3025; H01L 2224/48091; H01L 2924/00014; H01L 2924/00
USPC ........... 257/13, 79, 93, 94, 95, 96, 97, 98, 99, 257/100, 101, 102, 103, E33.001, E51.002, 257/E33.067
See application file for complete search history.

(56) References Cited

U.S. PATENT DOCUMENTS 6,466,135 B1 * 10/2002 Srivastava et al. ......... 340/815.4
2004/0145308 A1   7/2004 Rossner et al.
(Continued)

FOREIGN PATENT DOCUMENTS

DE   10 2006 024 165   11/2007
EP   1 119 058   7/2001
(Continued)

*Primary Examiner* — Cuong Q Nguyen
*Assistant Examiner* — Yosef Gebreyesus
(74) *Attorney, Agent, or Firm* — Hamre, Schumann, Mueller & Larson, P.C.

(57) ABSTRACT

A semiconductor light-emitting device according to the present invention is a semiconductor light-emitting device 10 including a solid-state light-emitting element 11 and a wavelength converter 12 that converts primary light emitted by the solid-state light-emitting element 11 into light having a longer wavelength, wherein the wavelength converter 12 includes a wavelength converting layer 12a made from a translucent inorganic formed body containing phosphors, and a binder layer 12b; the wavelength converter 12 is disposed on a main light extraction surface 11a of the solid-state light-emitting element 11; and the binder layer 12b is disposed along an emission direction of light emitted from the main light extraction surface 11a.

13 Claims, 9 Drawing Sheets

(51) Int. Cl.
*H01L 33/54* (2010.01)
*H01L 33/58* (2010.01)
*H01L 33/62* (2010.01)

(56) References Cited

U.S. PATENT DOCUMENTS

| | | | |
|---|---|---|---|
| 2005/0269582 A1 | 12/2005 | Mueller et al. | |
| 2005/0274967 A1* | 12/2005 | Martin et al. | 257/98 |
| 2006/0055309 A1* | 3/2006 | Ono et al. | 313/492 |
| 2006/0268537 A1* | 11/2006 | Kurihara et al. | 362/34 |
| 2007/0284600 A1 | 12/2007 | Shchekin et al. | |
| 2008/0203419 A1* | 8/2008 | Harada | 257/98 |
| 2008/0232085 A1 | 9/2008 | Luettgens et al. | |
| 2008/0315228 A1 | 12/2008 | Krames et al. | |
| 2009/0039375 A1 | 2/2009 | LeToquin et al. | |
| 2009/0057690 A1* | 3/2009 | Chakraborty | 257/88 |
| 2009/0140630 A1* | 6/2009 | Kijima et al. | 313/498 |
| 2009/0166667 A1 | 7/2009 | Sakata et al. | |
| 2009/0272998 A1 | 11/2009 | Berben et al. | |
| 2010/0038665 A1 | 2/2010 | Sugiura et al. | |
| 2010/0117106 A1* | 5/2010 | Trottier | 257/98 |
| 2010/0176751 A1* | 7/2010 | Oshio et al. | 315/362 |

FOREIGN PATENT DOCUMENTS

| | | |
|---|---|---|
| EP | 1 922 765 | 5/2008 |
| JP | 2004-146835 | 5/2004 |
| JP | 2006-005367 | 1/2006 |
| JP | 2006-179684 | 7/2006 |
| JP | 2008/004948 | 1/2008 |
| WO | 2007/018222 | 2/2007 |
| WO | 2007/023412 | 3/2007 |
| WO | 2007/051499 | 5/2007 |
| WO | 2008/044759 | 4/2008 |
| WO | 2008/096301 | 8/2008 |

* cited by examiner

A

B

SEMICONDUCTOR LIGHT-EMITTING DEVICE AND LIGHT SOURCE DEVICE USING THE SAME

TECHNICAL FIELD

The present invention relates to a semiconductor light-emitting device used for a point light source such as a projection light source and a vehicle headlight, and a light source device using the same.

BACKGROUND ART

An example of the aforementioned semiconductor light-emitting device is a white light-emitting diode (hereinafter referred to as a white LED) including a solid-state semiconductor element and a wavelength converter that converts primary light emitted by the solid-state semiconductor element into light having a longer wavelength. In such a white LED, for example, a light-emitting diode (hereinafter referred to as a LED chip) with an InGaN-based compound semiconductor used as a light-emitting layer has been used widely as a solid-state light-emitting element. Further, as the wavelength converter, for example, a resin phosphor film having a structure in which powdered phosphor is dispersed in a translucent resin has been adopted.

Recently, there is a growing demand for higher output semiconductor light-emitting devices. However, when the light output of phosphor excitation light emitted by the LED chip is increased by the higher output semiconductor light-emitting device, heat is generated due to energy loss (Stokes loss) accompanying phosphor wavelength conversion. This heat then is accumulated in the resin phosphor film and causes a temperature rise in the resin phosphor film, which results in temperature quenching of the phosphor and a decrease in photon conversion efficiency.

Further, the temperature rise in the resin phosphor film, etc., and strong irradiation of primary light emitted by the LED chip lead the translucent resin of the resin phosphor film to, for example, chemically react with peripheral members and the atmosphere. This adversely affects various properties of the translucent resin, such as decreases in light output, translucency, or the like.

Therefore, in order to suppress the temperature rise in the wavelength converter, it has been proposed to adopt, as the wavelength converter, a ceramic-based formed body having high thermal conductivity and superior heat dissipation properties, such as translucent phosphor ceramic, phosphor glass, and composite ceramic with an optical function (see, for example, Patent Literatures 1 and 2).

CITATION LIST

Patent Literature

PTL 1: JP 2004-146835 A
PTL 2: JP 2006-5367 A

SUMMARY OF INVENTION

Technical Problem

However, in the semiconductor light-emitting device using the conventional LED chip and ceramic-based formed body, the LED chip generates heat owing to power loss when emitting light (at the time of operation), and the ceramic-based formed body also generates heat owing to the Stokes loss. Here, since the thermal expansion coefficient of the ceramic-based formed body is larger than that of the LED chip, a stress caused by the difference in thermal expansion coefficient therebetween acts in the vicinity of a boundary of the ceramic-based formed body and the LED chip. Further, the rigidity of a ceramic-based phosphor is greater than that of the resin phosphor film, and therefore, when the aforementioned stress is generated, force applied to the LED chip is increased, which may decrease the reliability of the semiconductor light-emitting device. For example, in the case where an epitaxial layer of the LED chip is formed of a GaN-based compound semiconductor having cleavage properties, the compound semiconductor layer is fractured by the stress, which sometimes shortens the lifetime of the semiconductor light-emitting device.

The present invention solves the aforementioned conventional problems, and its object is to provide a semiconductor light-emitting device using a highly reliable ceramic-based formed body and a light source device using the same.

Solution to Problem

A semiconductor light-emitting device of the present invention is a semiconductor light-emitting device including a solid-state light-emitting element and a wavelength converter that converts primary light emitted by the solid-state light-emitting element into light having a longer wavelength, wherein the wavelength converter includes a wavelength converting layer made from a translucent inorganic formed body containing a phosphor, and a binder layer; the wavelength converter is disposed on a main light extraction surface of the solid-state light-emitting element; and the binder layer is disposed along an emission direction of light emitted from the main light extraction surface.

Further, the light source device of the present invention is characterized by including the aforementioned semiconductor light-emitting device of the present invention.

Advantageous Effects of Invention

According to the present invention, it is possible to provide a semiconductor light-emitting device using a highly reliable ceramic-based formed body and a light source device using the same.

DESCRIPTION OF EMBODIMENTS

Figure 1:
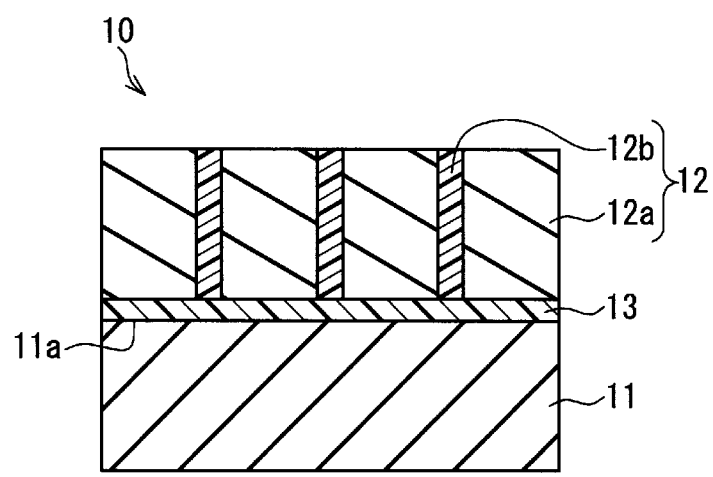
FIG. 1 is a schematic cross-sectional view showing a semiconductor light-emitting device according to Embodiment 1.
Figure 2:
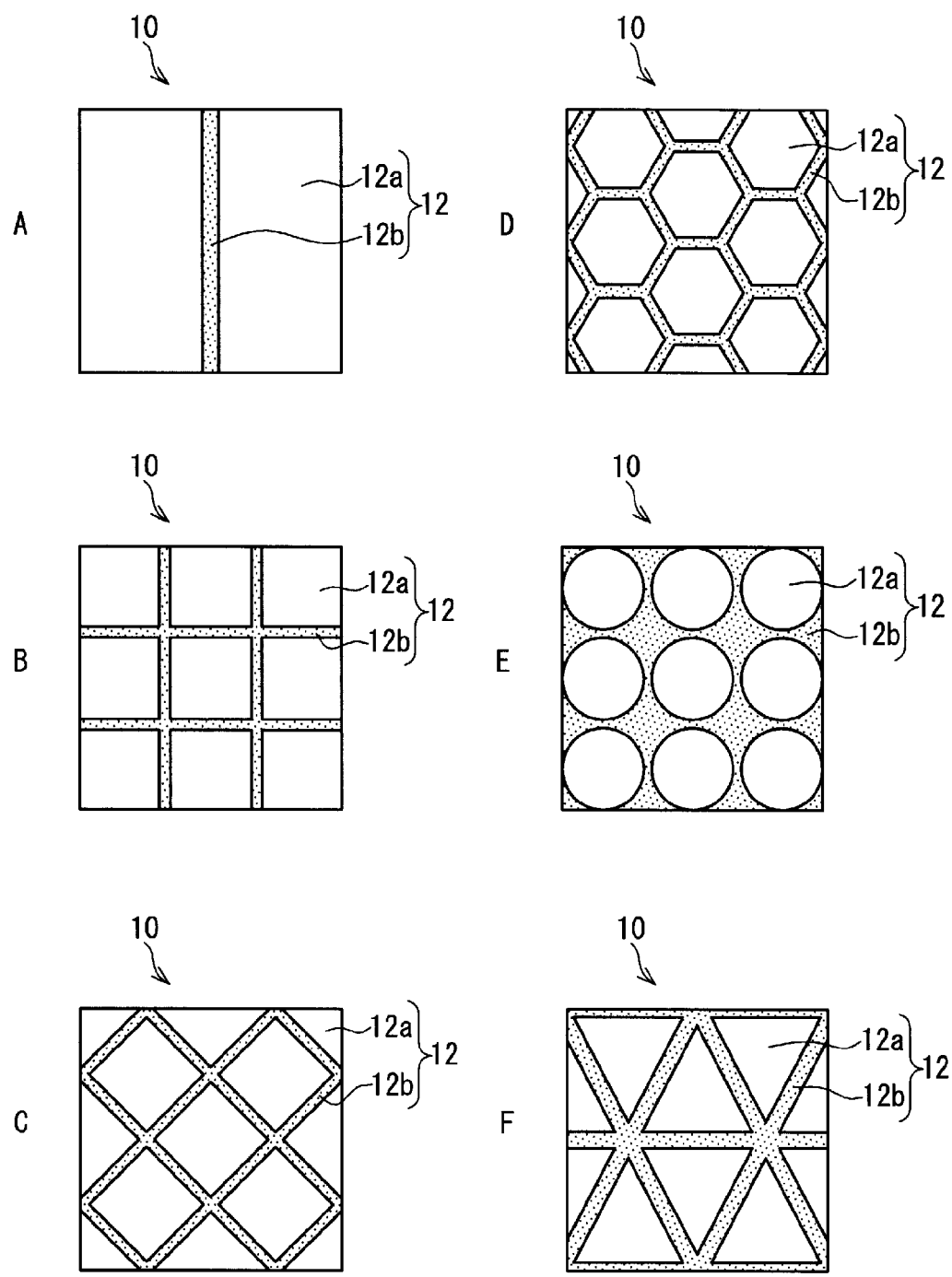
FIGS. 2A, 2B, 2C, 2D, 2E and 2F are plan views showing specific examples of a wavelength converter according to Embodiment 1.
Figure 3:
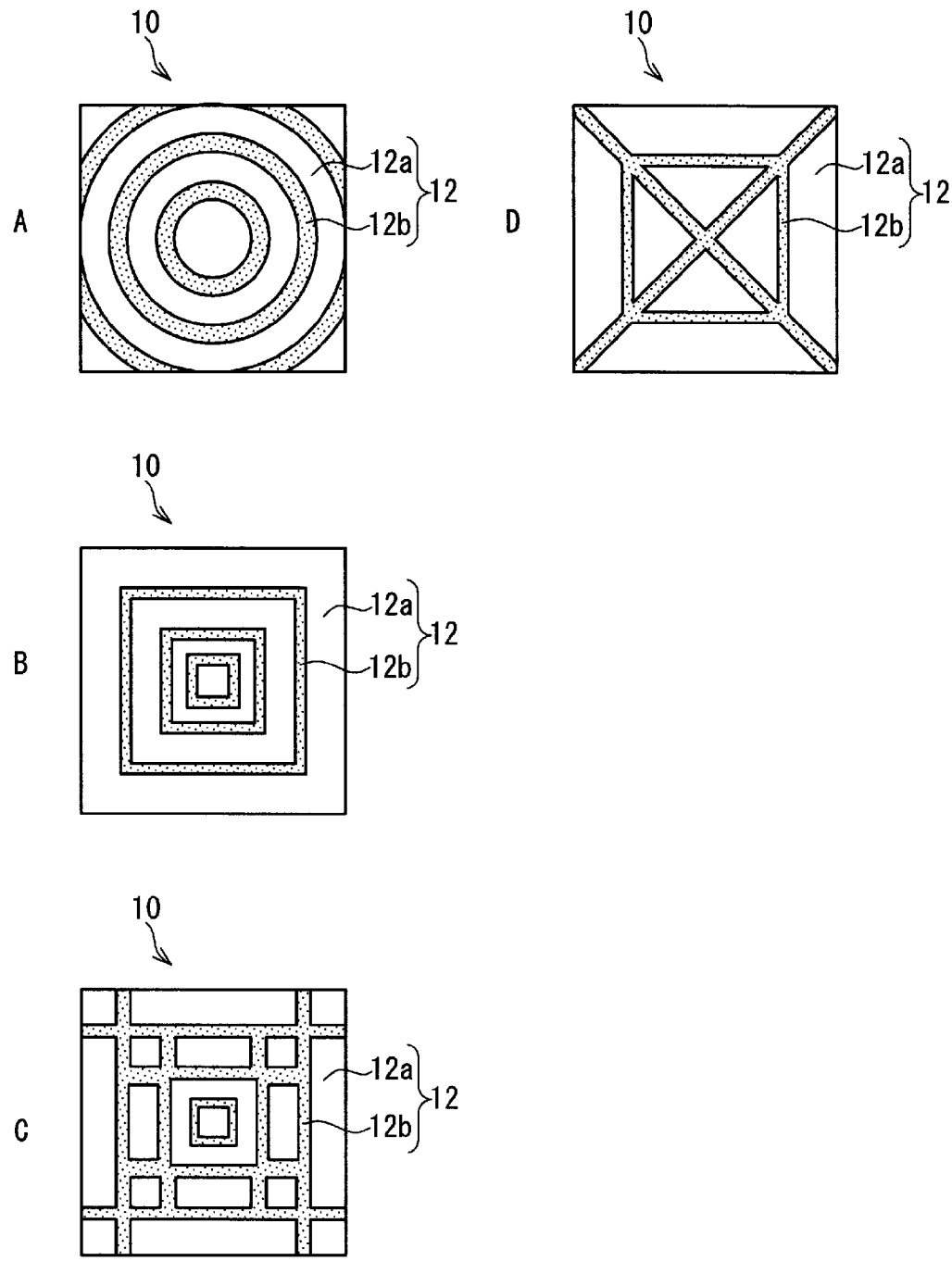
FIGS. 3A, 3B, 3C and 3D are plan views showing other specific examples of the wavelength converter according to Embodiment 1.
Figure 4:
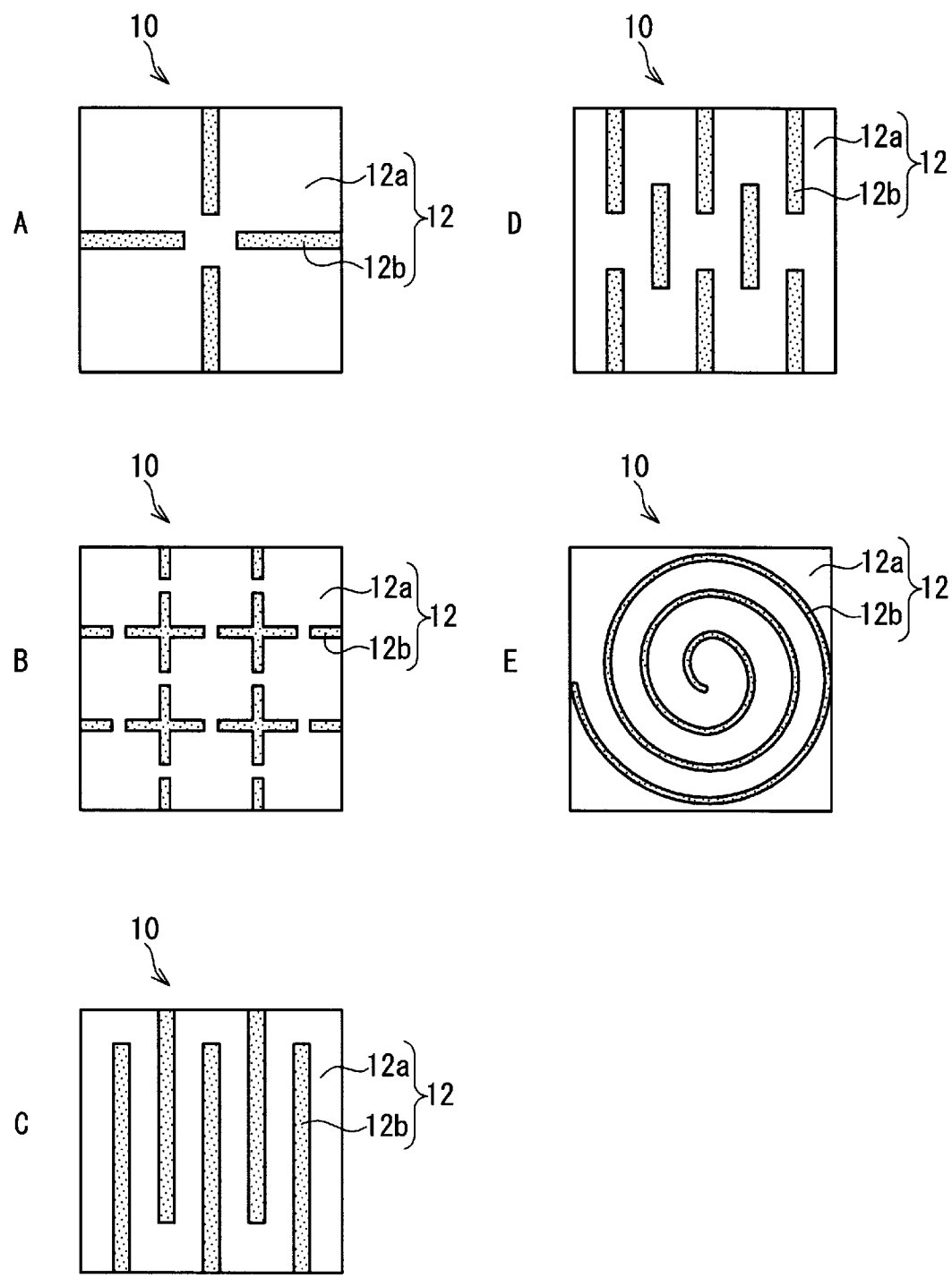
FIGS. 4A, 4B, 4C, 4D and 4E are plan views showing other specific examples of the wavelength converter according to Embodiment 1.
Figure 5:
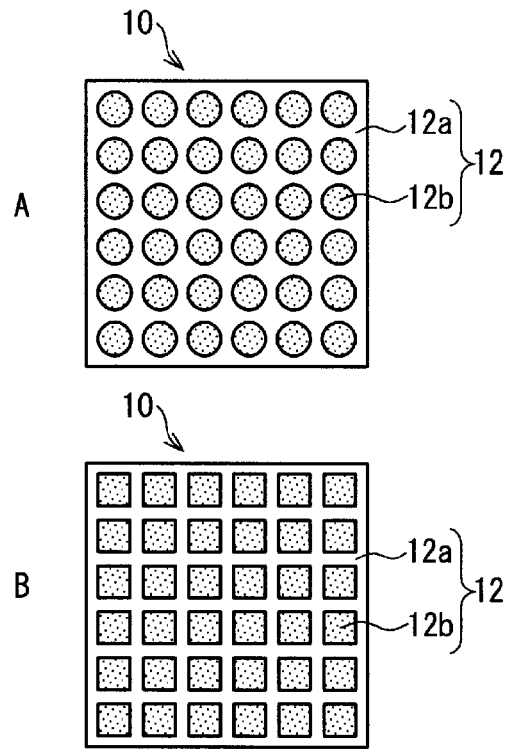
FIGS. 5A and 5B are plan views showing other specific examples of the wavelength converter according to Embodiment 1.
Figure 6:
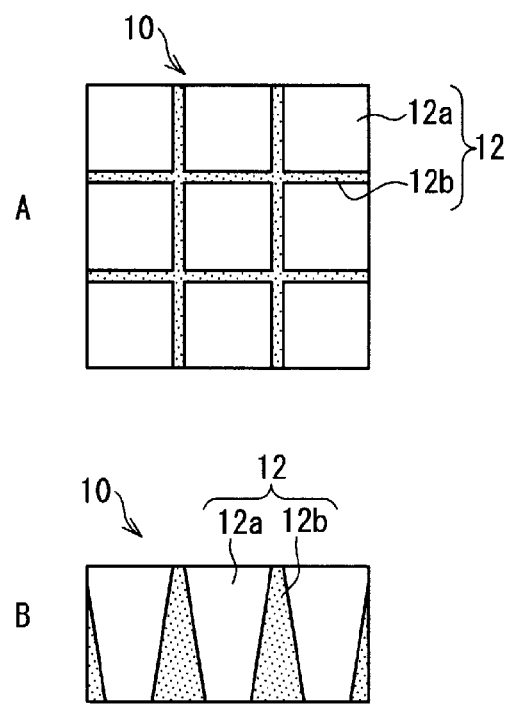
FIG. 6A is a plan view showing a modification example of the wavelength converter according to Embodiment 1.
FIG. 6B is a cross-sectional view of FIG. 6A.
Figure 7:
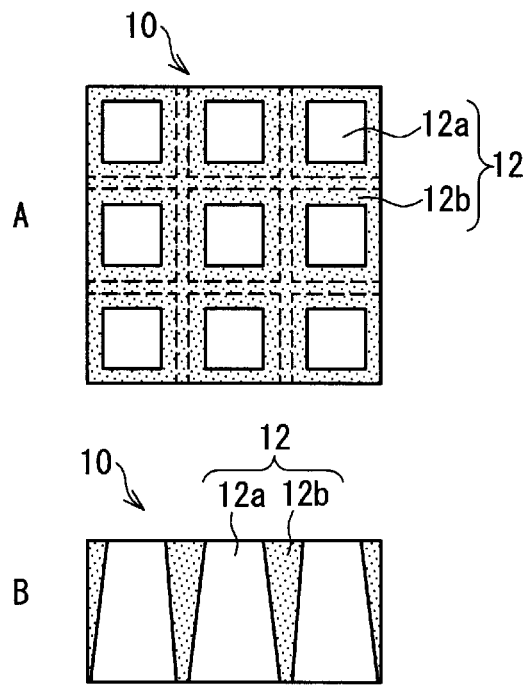
FIG. 7A is a plan view showing another modification example of the wavelength converter according to Embodiment 1.
FIG. 7B is a cross-sectional view of FIG. 7A.
Figure 8:
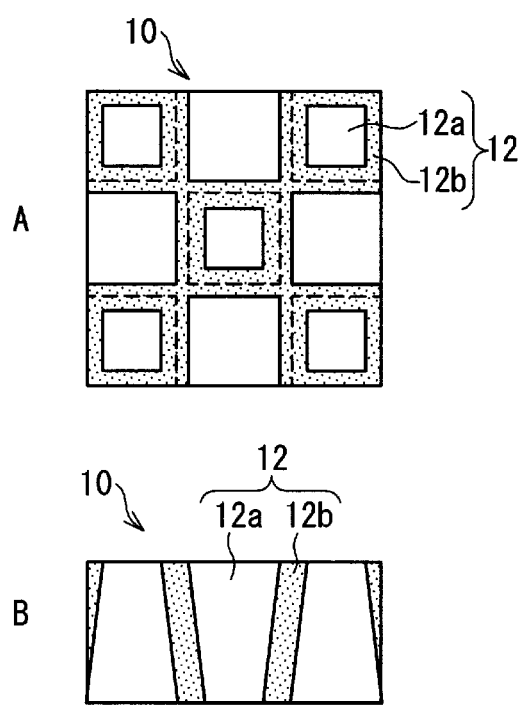
FIG. 8A is a plan view showing another modification example of the wavelength converter according to Embodiment 1.
FIG. 8B is a cross-sectional view of FIG. 8A.
Figure 9:
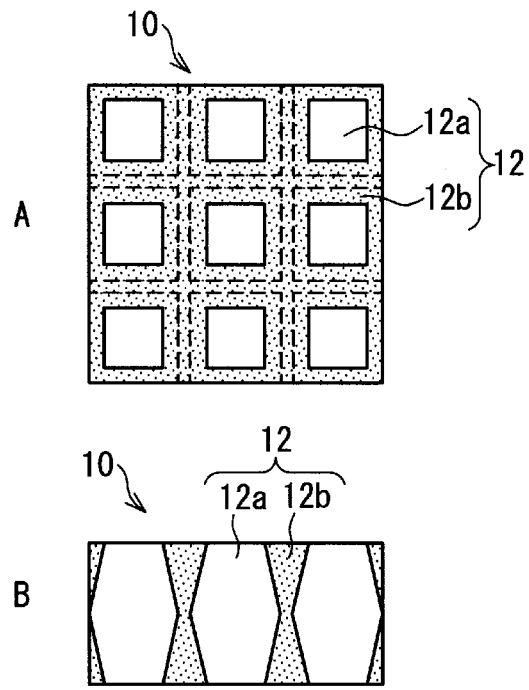
FIG. 9A is a plan view showing another modification example of the wavelength converter according to Embodiment 1.
FIG. 9B is a cross-sectional view of FIG. 9A.

Hereinafter, embodiments of the present invention will be described.

A semiconductor light-emitting device of the present invention includes a solid-state light-emitting element and a wavelength converter that converts primary light emitted by the solid-state light-emitting element into light having a longer wavelength. Further, the wavelength converter includes a wavelength converting layer made from a translucent inorganic formed body containing a phosphor, and a binder layer. Furthermore, the wavelength converter is disposed on a main light extraction surface of the solid-state light-emitting element, and the binder layer is disposed along an emission direction of light emitted from the main light extraction surface.

In the semiconductor light-emitting element of the present invention, even in the case where the solid-state light-emitting element as well as the wavelength converting layer generate heat and stress is caused by the difference in expansion coefficient between the solid-state light-emitting element and the wavelength converting layer, the binder layer can absorb the stress. Thus, the stress caused in the solid-state light-emitting element is relieved, and the reliability of the semiconductor light-emitting element is enhanced.

Further, in general, since the translucent inorganic formed body containing phosphors is made from high-transparent crystals, primary light output from a solid-state semiconductor element has high directivity. On the other hand, converted light output from the phosphor is emitted isotropically. Because of this, color separation sometimes has occurred in the conventional semiconductor light-emitting element. However, in the semiconductor light-emitting device according to the present invention, the existence of the binder layer allows the primary light of the solid-state semiconductor element to be scattered to some extent in the wavelength converter, whereby the color separation can be suppressed. Further, the addition of impurities to the wavelength converting layer, which has been performed to suppress the color separation, is no longer required, whereby the light transmittance of the wavelength converting layer can be improved, too.

The binder layer can have a function of mixing, by light scattering, at least a part of the primary light emitted by the solid-state light-emitting element, and a part of light emitted by the wavelength converter, the part of the primary light being a part thereof passing through the binder layer. This also suppresses the color separation.

Further, the binder layer also can have a function of blocking, at least partially, a part of the primary light emitted by the solid-state light-emitting element, the part of the primary light being a part thereof entering the binder layer. This also suppresses the color separation.

Since the binder layer has the above-described functions, it preferably includes one or more materials with the light-scattering function or light-shielding function that are selected from the group consisting of $Y_2O_3$, $Al_2O_3$, $SiO_2$, $ZrO_2$, glass beads and bubbles.

Further, the light source device of the present invention uses the above-described semiconductor light-emitting device of the present invention, which makes it possible to provide a highly reliable light source device. Examples of the light source device of the present invention include a headlight equipment such as a projection light source and a vehicle headlamp, or light sources for a liquid crystal backlight, camera flash, general lighting, etc.

Next, the semiconductor light-emitting device according to the present invention will be described based on the drawings.

Embodiment 1

FIG. 1 is a schematic cross-sectional view showing an exemplary semiconductor light-emitting device of the present invention. In FIG. 1, a semiconductor light-emitting device 10 includes a solid-state light-emitting element 11 and a wavelength converter 12 that converts primary light emitted by the solid-state light-emitting element 11 into light having a longer wavelength. Further, the wavelength converter 12 is composed of a wavelength converting layer 12a made from a translucent inorganic formed body containing phosphors, and a binder layer 12b. The wavelength converter 12 is adhered to a main light extraction surface 11a of the solid-state light-emitting element 11 via an adhesive layer 13 made from a translucent adhesive substance. The binder layer 12b is disposed in a direction perpendicular to the main light extraction surface 11a, which is an exemplary emission direction of the light emitted from the main light extraction surface 11a.

Here, the main light extraction surface refers to a light-emitting surface that emits the greatest amount of light out of the light-emitting surfaces of the solid-state light-emitting element.

The solid-state light-emitting element 11 is a photoelectric conversion element that converts electric energy into light. Specific examples of the solid-state light-emitting element 11 include a light-emitting diode, a laser diode, a surface-emitting laser diode, an inorganic electroluminescence element, an organic electroluminescence element, etc. In particular, the light-emitting diode or the surface-emitting laser diode is preferable from the aspect of increasing an output of the semiconductor light-emitting device. Basically, the wavelength of the light emitted by the solid-state light-emitting element 11 is not particularly limited, and it is only necessary that the wavelength thereof be within a wavelength range that allows the phosphors contained in the wavelength converting layer 12a to be excited. However, in order to produce a semiconductor light-emitting device with high light-emitting performance, in which the phosphors to be used are excited at a high efficiency and which emits white light, it is preferable to use a solid-state light-emitting element in the wavelength range of more than 340 nm to 500 nm, preferably more than 350 nm to 420 nm, or more than 420 nm to 500 nm, more preferably more than 360 nm to 410 nm, or more than 440 nm to 480 nm, that is, a solid-state light-emitting element having an emission peak in the wavelength range of near-ultraviolet, violet, or blue.

The wavelength converting layer 12a is formed of a translucent inorganic formed body containing phosphors, that is, ceramic or the like. Since the wavelength converting layer 12a includes the inorganic formed body (ceramic, etc) having high thermal conductivity and superior heat dissipation properties, it is possible to suppress a temperature rise in the wavelength converter.

The phosphor used in the wavelength converting layer 12a is not limited as long as it contains a constituent element group consisting of one or more elements selected from Mg, Ca, Sr, Ba, Y, La, Gd, Tb and Lu, and a part of the constituent element group has been replaced by $Ce^{3+}$. For example, YAG $(Y_3Al_5O_{12}:Ce^{3+})$, $Ca_3Sc_2Si_3O_{12}:Ce^{3+}$, $(Y, Gd)_3Al_5O_{12}:Ce^{3+}$, or the like can be used as the phosphor.

The binder layer 12b is arranged in the direction perpendicular to the main light extraction surface 11a, which is an exemplary emission direction of the light emitted from the main light extraction surface 11a, whereby it does not prevent light emission from the solid-state light-emitting element 11. Further, because of this arrangement, the wavelength converting layer 12a having high thermal conductivity exists continuously from the solid-state light-emitting element 11 toward an outward direction of the semiconductor light-emitting device 10, whereby a thermal conduction path is secured and the temperature rise in the wavelength converter 12 can be suppressed.

As to properties of the material for the binder layer 12b, the material preferably has a Young's modulus smaller than that of the inorganic formed body. Examples of the material include an organic adhesive, an epoxy resin, a silicone resin, a fluorocarbon resin, a ceramic-based adhesive, a sol-gel glass and a low-melting point glass.

Further, the binder layer 12b can contain phosphors. Thus, even if single phosphor ceramic or the like is used in the wavelength converting layer 12a, it is possible to realize multiple colors in the wavelength converter 12.

The phosphor contained in the binder layer 12b preferably is a red phosphor emitting red light. In general, it is difficult to use the red phosphor in a ceramic form, and hence, by using the red phosphor in the binder layer 12b, the wavelength converter 12 can obtain high color rendering properties.

The adhesive substance used in the adhesive layer 13 is not particularly limited as long as it can bond the solid-state light-emitting element 11 and the wavelength converter 12 together, and has translucency. For example, an organic adhesive, an epoxy resin, a silicone resin, a fluorocarbon resin, a ceramic-based adhesive, a sol-gel glass and a low-melting point glass can be used as the adhesive substance.

Further, the adhesive layer 13 preferably is composed of the same material as that of the binder layer 12b. This is because using the same material makes it possible to extract light passing from the adhesive layer 13 through the binder layer 12b smoothly, which improves light extraction efficiency, and also makes it possible to strengthen the adhesiveness of the adhesive layer 13 with respect to the binder layer 12b.

Water tends to mix in the adhesive layer 13, which becomes a cause of electrical failures. In the conventional semiconductor light-emitting device, the inorganic formed body having no moisture permeability acts as a block, and hence water in the adhesive layer has hardly been released to the outside. Meanwhile, since the binder layer 12b penetrates through the wavelength converter 12, the water in the adhesive layer 13 can be released to the outside via the binder layer 12b. This also enhances the reliability of the semiconductor light-emitting device 10.

A method for producing the semiconductor light-emitting device 10 is not particularly limited, but it may be produced as follows: an adhesive substance is coated on the solid-state light-emitting element 11; the wavelength converter 12 is disposed thereon; and the solid-state light-emitting element 11 and the wavelength converter 12 are bonded with each other.

Next, specific examples of the wavelength converter 12 according to the present embodiment will be described based on FIGS. 2 to 9. In FIGS. 2 to 9, portions that are functionally the same as those in FIG. 1 are given the same reference numerals, and duplicate descriptions are omitted.

In the semiconductor light-emitting device 10 of the present embodiment shown in FIG. 1, the binder layer 12b is disposed in the direction perpendicular to the main light extraction surface 11a and penetrates through the wavelength converter 12. However, some other specific examples or modification examples thereof can be considered. First, an example in which the wavelength converting layer 12a is divided by the binder layer 12b will be described. FIGS. 2A to 2F are plan views showing specific examples of the wavelength converter according to the present embodiment, each of which exemplifies the divided pattern of the wavelength converter by the binder layer, with the semiconductor light-emitting element 10 shown in FIG. 1 seen from an upper side of the wavelength converter 12. In FIGS. 2A to 2F, the wavelength converter 12 is divided by the binder layer 12b into a plurality of the wavelength converting layers 12a. FIG. 2A is an example in which the wavelength converter 12 is divided into rectangular shapes; FIG. 2B is an example in which the wavelength converter 12 is divided into square shapes; FIG. 2C also is an example in which the wavelength converter 12 is divided into square shapes; FIG. 2D is an example in which the wavelength converter 12 is divided into polygonal (hexagonal) shapes; FIG. 2E is an example in which the wavelength converter 12 is divided into circular shapes; and FIG. 2F is an example in which the wavelength converter 12 is divided into triangular shapes. The wavelength converters 12 of FIGS. 2A to 2F may be formed as follows: a phosphor material is sintered so as to form phosphor formed bodies having respective shapes; and they are bonded with each other by a binder.

In the case where the wavelength converting layer 12a is divided by the binder layer 12b as described above, and even if color separation occurs in each of the divided wavelength converting layers 12a, light beams emitted from the respective wavelength converting layers 12a are mixed, whereby the color separation of the wavelength converter 12 as a whole can be suppressed.

Further, FIGS. 3A to 3D are plan views showing other specific examples of the wavelength converter according to the present embodiment, each of which illustrates a modification example of the divided pattern of the wavelength converter by the binder layer, with the semiconductor light-emitting element 10 shown in FIG. 1 seen from the upper side of the wavelength converter 12. The wavelength converters 12 shown in FIGS. 3A to 3D may be formed as follows: a phosphor material is sintered so as to form a phosphor formed body; the phosphor formed body is cut by repeatedly being irradiated using a laser dicer on the same line; and the respective phosphor formed bodies after cutting are bonded with each other by a binder.

Next, an example in which the wavelength converting layer 12a is not divided by the binder layer 12b will be described.

FIGS. 4A to 4E are plan views showing other specific examples of the wavelength converter according to the present embodiment, each of which exemplifies a formation pattern of the binder layer, with the semi-conductor light-emitting element 10 shown in FIG. 1 seen from the upper side of the wavelength converter 12. In FIGS. 4A to 4E, each of the wavelength converters 12 is not divided completely by the binder layer 12b and is connected continuously. The wavelength converters 12 in FIGS. 4A to 4E may be formed as follows: a phosphor material is sintered so as to form a phosphor formed body; the phosphor formed body is cut partially by repeated irradiation using a laser dicer on line segments that need to be cut, so as to form cut portions; and the cut portions are filled with a binder.

Further, FIGS. 5A and 5B are plan views showing other specific examples of the wavelength converter according to the present embodiment, each of which specifically illustrates an example in which the binder layer 12b is formed by filling through-holes with a binder, with the semiconductor light-emitting element 10 shown in FIG. 1 seen from the upper side of the wavelength converter 12. In FIG. 5A, cylindrical through-holes are formed; and in FIG. 5B, square through-holes are formed. The wavelength converters 12 in FIGS. 5A and 5B may be formed as follows: a phosphor material is sintered so as to form a phosphor formed body; a dimple forming process is performed using a laser dicer by controlling laser irradiation and moving shaft speed; through-holes are formed in the phosphor formed body by repeating the above-described process on the same portions; and the through-holes are filled with a binder.

Further, FIG. 6A is a plan view showing a modification example of the wavelength converter according to the present embodiment, and FIG. 6B is a cross-sectional view of FIG. 6A. In FIG. 6B, a cross section of the binder layer 12b is formed in a tapered shape whose width decreases upward.

FIG. 7A is a plan view showing another modification example of the wavelength converter according to the present embodiment, and FIG. 7B is a cross-sectional view of FIG. 7A. In FIG. 7B, a cross section of the binder layer 12b is formed in a tapered shape whose width increases upward.

FIG. 8A is a plan view showing another modification example of the wavelength converter according to the present embodiment, and FIG. 8B is a cross-sectional view of FIG. 8A. In FIG. 8B, a cross section of the binder layer 12b is oriented in an oblique direction.

FIG. 9A is a plan view showing another modification example of the wavelength converter according to the present embodiment, and FIG. 9B is a cross-sectional view of FIG. 9A. In FIG. 9B, a cross section of the binder layer 12b is constricted in the central portion.

The wavelength converters of FIGS. 6A, 6B, 7A and 7B may be formed as follows: a phosphor material is sintered so as to form a phosphor formed body; the phosphor formed body is cut into pieces by a blade dicer using a taper angle formed on a blade tip; and the respective pieces thereof are bonded with each other by a binder. The wavelength converter of FIGS. 8A and 8B may be formed as follows: after pieces are made by cutting the phosphor formed body as in FIGS. 7A and 7B, the respective pieces thereof are reorganized randomly and bonded with each other by a binder. Further, the wavelength converter of FIGS. 9A and 9B may be formed as follows: after the phosphor formed body is cut as in FIGS. 7A and 7B to the half thickness from one of the surfaces, it is cut in the same manner from the opposing surface to be cut into pieces; and the respective pieces thereof are bonded with each other by a binder.

Embodiment 2

Figure 10:
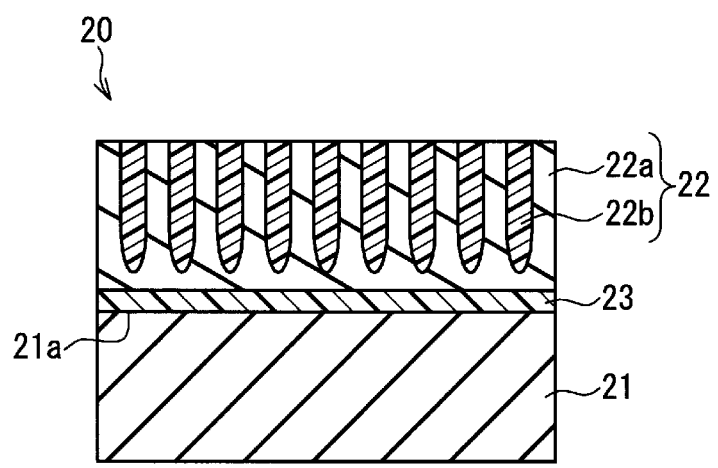
FIG. 10 is a schematic cross-sectional view showing a semiconductor light-emitting device according to Embodiment 2.

FIG. 10 is a schematic cross-sectional view showing another exemplary semi-conductor light-emitting device of the present invention. In FIG. 10, a semiconductor light-emitting device 20 includes a solid-state light-emitting element 21 and a wavelength converter 22 that converts primary light emitted by the solid-state light-emitting element 21 into light having a longer wavelength. Further, the wavelength converter 22 is composed of a wavelength converting layer 22a made from a translucent inorganic formed body containing phosphors, and a binder layer 22b. The wavelength converter 22 is adhered to a main light extraction surface 21a of the solid-state light-emitting element 21 via an adhesive layer 23 made from a translucent adhesive substance. The binder layer 22b is disposed in a direction perpendicular to the main light extraction surface 21a, which is an exemplary emission direction of the light emitted from the main light extraction surface 21a.

The present embodiment is different from the above-described Embodiment 1 mainly in that the binder layers 22b do not penetrate through the wavelength converter 22. Since the other portions are the same as those in Embodiment 1, duplicate descriptions are omitted. Further, all the wavelength converters according to the present embodiment may be formed as follows: a phosphor material is sintered so as to form a phosphor formed body; grooves are formed in the phosphor formed body using a laser dicer by controlling the number of repetitions of laser irradiation until they reach a pre-determined depth; and the grooves are filled with a binder.

Figure 11:
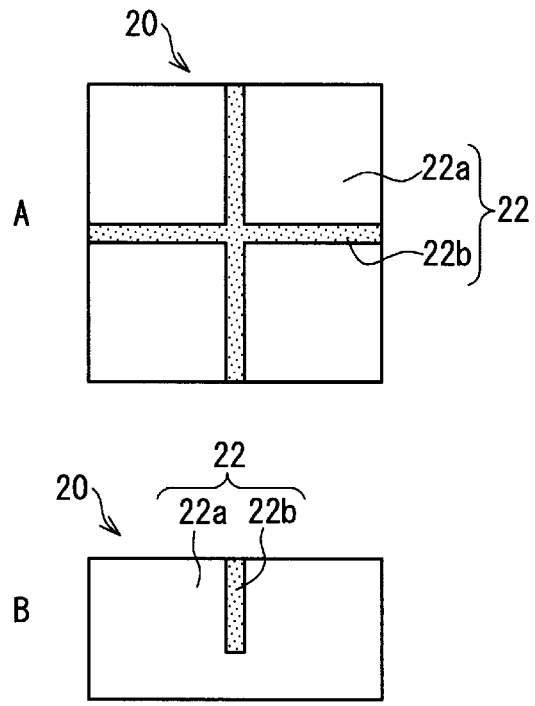
FIG. 11A is a plan view showing a specific example of a wavelength converter according to Embodiment 2.
FIG. 11B is a cross-sectional view of FIG. 11A.

FIG. 11A is a plan view showing a specific example of the wavelength converter according to the present embodiment, and FIG. 11B is a cross-sectional view of FIG. 11A. In FIG. 11B, the binder layer 22b is formed in a groove shape that opens upward.

Figure 12:
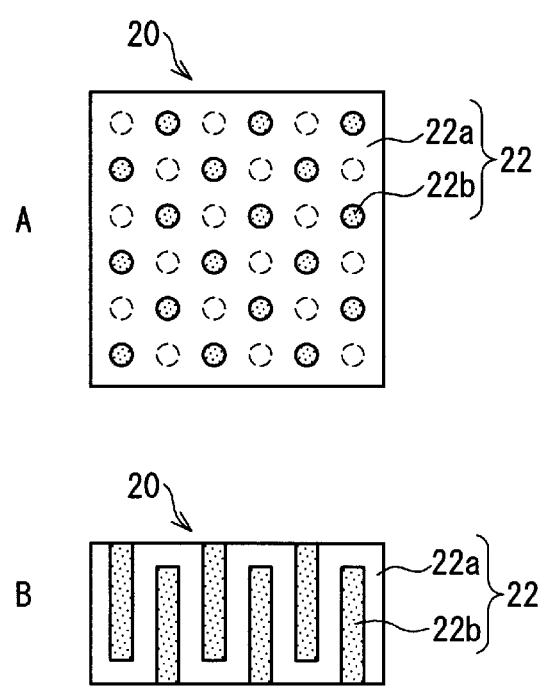
FIG. 12A is a plan view showing another specific example of the wavelength converter according to Embodiment 2.
FIG. 12B is a cross-sectional view of FIG. 12A.

FIG. 12A is a plan view showing another specific example of the wavelength converter according to the present embodiment, and FIG. 12B is a cross-sectional view of FIG. 12A. In FIG. 12B, each of the binder layers 22b is formed in a cylindrical shape that opens upward or downward.

Embodiment 3

Figure 13:
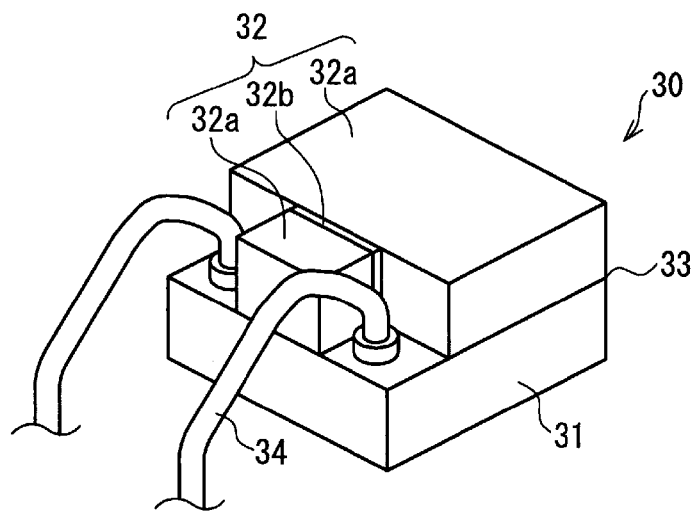
FIG. 13 is a perspective view showing a semiconductor light-emitting device according to Embodiment 3.

FIG. 13 is a perspective view showing another exemplary semiconductor light-emitting device of the present invention. In FIG. 13, a semiconductor light-emitting device 30 includes a solid-state light-emitting element 31 and a wavelength converter 32 that converts primary light emitted by the solid-state light-emitting element 31 into light having a longer wavelength. Further, the wavelength converter 32 is composed of wavelength converting layers 32a made from a translucent inorganic formed body containing phosphors, and a binder layer 32b. The wavelength converter 32 is adhered to a main light extraction surface of the solid-state light-emitting element 31 via an adhesive layer 33 made from a translucent adhesive substance. The binder layer 32b is disposed in a direction perpendicular to the main light extraction surface. Further, the solid-state light-emitting element 31 is provided with power supply electrodes 34, so that the wavelength converter 32 is arranged on the main light extraction surface so as to avoid the power supply electrodes 34.

In the semiconductor light-emitting device 30 according to the present embodiment, the wavelength converting layers 32a are formed in various sizes and can be disposed via the adhesive layer 33 in a position to avoid the power supply electrodes 34. Therefore, it is possible to increase a degree of freedom in an arrangement pattern of the wavelength converter 32. In contrast, in the case where the wavelength converting layer is formed integrally from the beginning, it is necessary to fabricate the wavelength converter into a polygonal shape to avoid the power supply electrodes 34, which presumably complicates a production process of the wavelength converter. The present invention does not have such a problem.

Embodiment 4

Figure 14:
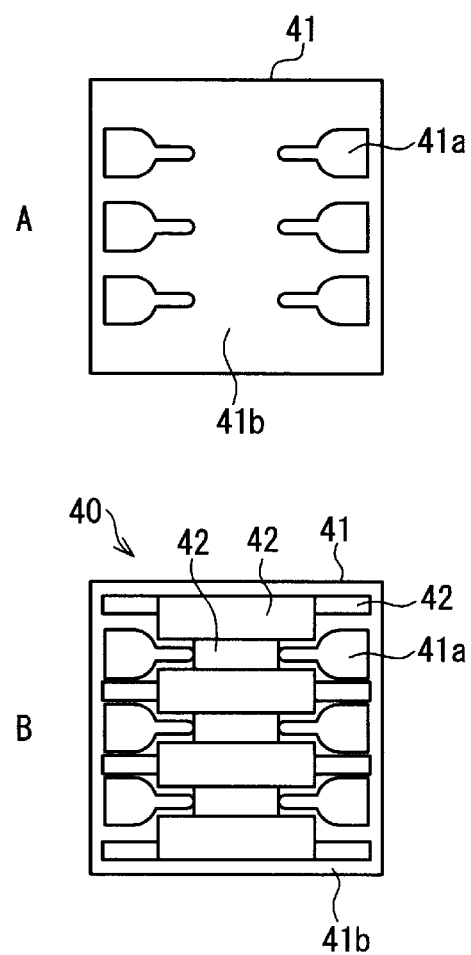
FIG. 14A is a plan view of a solid-state light-emitting element according to Embodiment 4.
FIG. 14B is a plan view of a semiconductor light-emitting device according to Embodiment 4.

FIG. 14A is a plan view of a solid-state light-emitting element 41 according to the present embodiment in which, in a main light extraction surface of the solid-state light-emitting element 41, n-type wirings 41a are formed on a light-emitting surface 41b. FIG. 14B is a plan view of a semiconductor light-emitting device 40 according to the present embodiment in which respective wavelength converting layers 42 are disposed on the light-emitting surface 41b of the solid-state light-emitting element 41. The respective wavelength converting layers 42 are formed in block shapes and are bonded integrally with each other via a binder layer (not shown).

In the semiconductor light-emitting device 40 according to the present embodiment, the wavelength converting layers 42 are formed in various sizes and can be disposed via the adhesive layer (not shown) in desired positions. Therefore, it is possible to increase the degree of freedom in an arrangement pattern of the wavelength converter. In other words, in the present embodiment, the wavelength converting layers 42 can be disposed so as to avoid portions of the n-type wirings 41a, from which light cannot be extracted.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

According to the present invention, it is possible to provide a semiconductor light-emitting device using a highly reliable ceramic-based formed body and a light source device using the same.

REFERENCE SIGNS LIST

10, 20, 30, 40 semiconductor light-emitting device
11, 21, 31, 41 solid-state light-emitting element
12, 22, 32 wavelength converter
13, 23, 33 adhesive layer

The invention claimed is:

1. A semiconductor light-emitting device comprising:
a solid-state light-emitting element; and
a wavelength converter that converts primary light emitted by the solid-state light-emitting element into light having a longer wavelength, wherein
the wavelength converter includes a binder layer comprising a phosphor and a wavelength converting layer made from a single phosphor ceramic,
the phosphor of the binder layer consists of a red phosphor, the wavelength converting layer is divided by the binder layer,
the wavelength converter is disposed on a main light extraction surface of the solid-state light-emitting element, and
the binder layer is disposed along an emission direction of light emitted from the main light extraction surface.

2. The semiconductor light-emitting device according to claim 1, wherein the binder layer is disposed in a direction perpendicular to the main light extraction surface.

3. The semiconductor light-emitting device according to claim 1, wherein the binder layer penetrates through the wavelength converter.

4. The semiconductor light-emitting device according to claim 1, wherein the wavelength converter is adhered to the main light extraction surface of the solid-state light-emitting element via a translucent adhesive layer.

5. The semiconductor light-emitting device according to claim 4; wherein the adhesive layer is composed of the same material as that of the binder layer.

6. The semiconductor light-emitting device according to claim 1, wherein the solid-state light-emitting element includes a power supply electrode on a side of the main light extraction surface, and the wavelength converter is disposed on the main light extraction surface in such a manner as to avoid the power supply electrode.

7. The semiconductor light-emitting device according to claim 1, wherein the solid-state light-emitting element includes a n-type wiring, and the wavelength converter is disposed on the main light extraction surface in such a manner as to avoid the n-type wiring.

8. The semiconductor light-emitting device according to claim 1, wherein the binder layer has a function of mixing, by light scattering, at least a part of the primary light emitted by the solid-state light-emitting element, and a part of light emitted by the wavelength converter, the part of the primary light being a part thereof passing through the binder layer.

9. The semiconductor light-emitting device according to claim 8, wherein the binder layer includes one or more materials with a light-scattering function or light-shielding function that are selected from the group consisting of $Y_2O_3$, $Al_2O_3$, $SiO_2$, $ZrO_2$, glass beads and bubbles.

10. The semiconductor light-emitting device according to claim 1, wherein the binder layer has a function of blocking, at least partially, a part of the primary light emitted by the solid-state light-emitting element, the part of the primary light being a part thereof entering the binder layer.

11. The semiconductor light-emitting device according to claim 10, wherein the binder layer includes one or more materials with a light-scattering function or light-shielding function that are selected from the group consisting of $Y_2O_3$, $Al_2O_3$, $SiO_2$, $ZrO_2$, glass beads and bubbles.

12. The semiconductor light-emitting device according to claim 1, wherein the wavelength converting layer exists continuously from the solid-state light-emitting element toward an outward direction.

13. A light source device comprising the semiconductor light-emitting device according to claim 1.

* * * * *